United States Patent [19]
Cernigliaro et al.

[11] Patent Number: 5,885,343
[45] Date of Patent: Mar. 23, 1999

[54] DYED SILICA PIGMENTS AND PRODUCTS MADE FROM SAME

[75] Inventors: George J. Cernigliaro, Freeport, Me.; Egon Matijevic, Potsdam, N.Y.; Daniel Y. Pai, Millbury; Todd A. Richardson, Lowell, both of Mass.

[73] Assignee: Shipley Company, L.L.C., Marlborough, Mass.

[21] Appl. No.: 865,722

[22] Filed: May 30, 1997

[51] Int. Cl.$^6$ .................................................. C07B 14/04
[52] U.S. Cl. ..................... 106/482; 106/287.34; 106/487; 106/493; 353/84; 349/1; 349/80; 349/106; 359/885; 430/20
[58] Field of Search ............................. 106/287.34, 482, 106/487, 493; 428/403, 404; 349/1, 106, 80; 430/20; 359/885; 353/84

[56] References Cited

U.S. PATENT DOCUMENTS

| | | | |
|---|---|---|---|
| 4,241,042 | 12/1980 | Matijevic et al. | 423/610 |
| 4,675,251 | 6/1987 | Matijevic et al. | 428/404 |
| 4,755,373 | 7/1988 | Gherardi et al. | 423/598 |
| 5,015,452 | 5/1991 | Matijevic | 423/263 |
| 5,248,556 | 9/1993 | Matijevic et al. | 428/403 |
| 5,318,628 | 6/1994 | Matijevic et al. | 106/499 |
| 5,318,797 | 6/1994 | Matijevic et al. | 427/213.31 |
| 5,344,489 | 9/1994 | Matijevic et al. | 106/442 |
| 5,401,313 | 3/1995 | Supplee et al. | 106/712 |

FOREIGN PATENT DOCUMENTS

| | | |
|---|---|---|
| WO 92/21726 | 12/1992 | WIPO. |
| WO 94/21733 | 9/1994 | WIPO. |

OTHER PUBLICATIONS

Carotenuto, et al., "Preparation and Characterization of Nanocomposite Thin Films for Optical Devices", *Ind. Eng. Chem. Res.* 1996, 35, 2929–2932.

Charreyre, et al., "Adsorption of Rhodamine 6G onto Polystyrene Latex Particles with Sulfate Groups at the Surface", *Journal of Colloid and Interface Science*, 170, 374–382 (1995).

Fleming, "Adsorption with Aluminas in Systems with Competing Water", *Fundamentals of Adsorption*, Athanasios I. Liapis, Ed., Engineering Foundation, New York, pp. 221–234, 1986.

Giesche et al., "Well–Defined Pigments: I. Monodispersed Silica–Acid Dyes Systems", *Dyes and Pigments*, 17 (1991) 323–340.

Hsu et al., "Well–Defined Colloidal Pigments. II: Monodispersed Inorganic Spherical Particles Containing Organic Dyes", *Dyes and Pigments*, 19 (1992) 179–201.

Jan et al., "Adsorption of Metanil Yellow on a positively charge–modified nylon 66 membrane", *Colloid Surfaces*, 92, 1–7. 1994.

McKay et al., "Adsorption of Dyes on Chitin. I. Equilibrium Studies", *Journal of Applied Polymer Science*, vol. 27, 3043–3057 (1982).

(List continued on next page.)

*Primary Examiner*—Mark L. Bell
*Assistant Examiner*—Scott L. Hertzog
*Attorney, Agent, or Firm*—Robert L. Goldberg; Peter F. Corless; Darryl P. Frickey

[57] ABSTRACT

The adsorption of cationic dyes on nanosize negatively charged silica particles to form colored pigments is disclosed. The dyes are chemisorbed and their uptake is controlled by the strong chemical reaction between the negative surface of the adsorbent silica particles preferably with sodium counter ions and the positive charge of the dyes. The prepared pigments are useful in the formation of color films and their optical properties are described. Photoresists using nanosized pigments are also disclosed herein which are useful in making color filters for liquid crystal displays.

16 Claims, 1 Drawing Sheet

OTHER PUBLICATIONS

Mishra, et al., "Sorption–Desorption Studies of Anionic Dyes on Alumina Pretreated with Acids", *Journal of Colloid and interface Science*, vol. 129, No. 1, Apr. 1989, 41–52.

Tentorio et al., "Preparation and Optical Properties of Spherical Colloidal Aluminum Hydroxide Particles Containing a Dye", *Journal of Colloid and Interface Science*, vol. 77, 418–426, 1980.

Winnik et al., "New Water–Dispersible Silica–Based Pigments: Synthesis and Characterization", *Dyes and Pigments*, vol. 14, (1990), 101–112.

Jain et al., "Sorption–Desorption Studies of Anionic Dyes on Alumina Pretreated with Acids", *Colloids and Surfaces*, vol. 29, (1988) 373–389.

DYED SILICA PIGMENTS AND PRODUCTS MADE FROM SAME

BACKGROUND OF THE INVENTION

This invention is directed to small size pigments of less than about 35 nm in average diameter which are formed of an cationic dye coating adsorbed on negatively charged silica particles. The color pigments formed in this invention are useful in color films as well as in various applications such as color filters for liquid crystal displays and in various other applications such as in ink jet color printing for color filter applications.

The interactions between dyes and solid surfaces may involve covalent bond formation or physical forces (electrostatic and/or van der Waals). For example, reactive dyes were grafted to the surface of derivatized silicas to prepare water-dispersible pigments for ink-jets (Winnik et al., *Dyes and Pigments*, 14, 101 (1990)). A number of studies (See: McKay et al., *J. Appl. Plym. Sci.*, 27, 3043 (1982); Fleming, H. L., "*Fundamentals of Adsorption*", pp. 221, Athanasios I. Liapis, Ed., Engineering Foundation, New York, 1987; Jain et al., *Colloid Surf.*, 29, 373 (1988); Mishara et al., *J. Colloid Interface Sci.*, 129, 41 (1984); Charreyre et al., *J. Colloid Interface Sci.*, 170, 374 (1995); Jan et al., *Colloid Surf.*, 92, 1 (1994)) dealt with the adsorption of dyes on charged solids, e.g. McKay et al., supra, investigated the adsorption of dyestuffs on chitin. Because of the porosity of the latter, it was difficult to establish the adsorption mechanism; over a limited dye concentration range, both Langmuir and Freundlich isotherms could fit the data. When alumina was used as adsorbent (See: Fleming, H. L., "*Fundamentals of Adsorption*", pp. 221, Athanasios I. Liapis, Ed., Engineering Foundation, New York, 1987; Jain et al., *Colloid Surf.*, 29, 373 (1988); Mishara et al., *J. Colloid Interface Sci.*, 129, 41 (1984)) the uptake of dyes was strongly dependent on the particle morphology, method of preparation, pretreatment of the solids and the equilibrium pH conditions. As a result of these issues, alumina particles are not considered practical for this application.

This invention discloses the formation of colored pigments by interacting several cationic dyes with negatively charged silica particles where the counter ion is ammonium or sodium. The advantage of this adsorbent is in its small size (<30 nm) and the negative charge of the surface. Previous studies (See: Giesche et al., *Dyes & Pigments*, 17, 323 (1991); Hsu et al., *Dyes & Pigments*, 19, 179 (1992); Carotenuto et al., *Ind. Eng. Chem. Res.* 35, 2929 (1996); Tentorio et al., *J. Colloid Interface Sci.*, 77, 418 (1980)) showed that adsorbing dyes on solid surfaces or incorporating them into inorganic particles can yield reproducible pigments of superior optical and mechanical properties.

Reference should also be had to the following U.S. Pat. Nos: 5,344,489, 5,318,797, 5,318,628, 5,248,556, 5,015,452, 4,755,373, 4,675,251 and 4,241,042 relating to pigments for further background information. Also background information relating to this field is to be found in WO 92/21726 published Dec. 12, 1992 and WO 94/21733 published Sept. 29, 1994.

This invention also is directed to color filters for a color liquid crystal display (LCD) and more particularly to imaging color filter resists such as negative tone color filter photoresists for both primary additive and secondary subtractive colors also utilizing nanosized colored pigments. It is also disclosed in this invention the use of top imaging positive or negative-tone photoresists prepared with nanosized pigments, through which color pattern is delineated via aqueous alkaline development or solvent removal.

It is essential for color filter application that the pigment particles yield transparent filters of high contrast. In order to achieve these properties, it is necessary for pigment particles to be small, uniform in size, and fully dispersed in the polymer, in order to minimize light scattering effects, which would adversely affect the transparency. Furthermore, for the same reason above, refractive index of the core material was found to be necessary for the subject application. The small and uniform size of pigments produced herein are found to meet these requirements. The silica core size in the range of less than 35 nm colored with dyes will yield completely transparent filters in said polymers. The low refractive index contributes to the transparency of color filters and will provide an unexpectedly high contrast.

In contrast, the pigments described in U.S. Pat. Nos. 5,318,628 and 5,344,489 are considerably larger particles, and as such, are not suitable for color filters or colored ink jets for making colored filters.

In addition, particles of higher refractive index in these patents would also not be suitable for colored filters because of significant scattering effects which reduces transparency.

For background description of a color filter for an LCD and the method of producing the same reference should be had to U.S. Pat. No. 5,278,009.

BRIEF DESCRIPTION OF THIS DISCLOSURE

Figure 1:
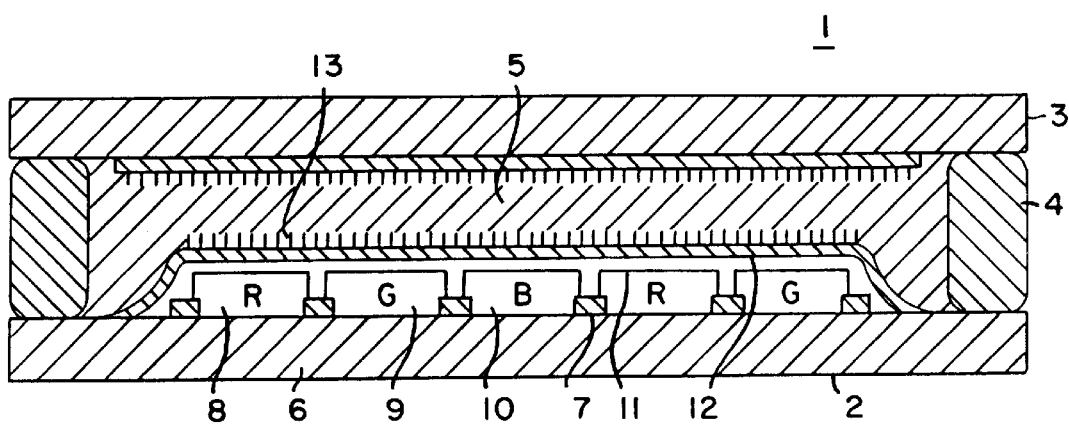
FIG. 1 is a sectional view of one example of a color liquid crystal display made with the dyed pigments of this invention in a resin binder to provide a solid color filter thereof.

This disclosure is directed to dyed nanosized substantially spherical colored pigments of negatively charged silica where sodium or ammonium is the stabilizing counter cation or where the solution of the particles is deionized to which there is adsorbed cationic dyes. The pigments are useful for various applications such as color films, resists, color filters and for a liquid crystal display and in ink jet printing.

The pigments prepared by the method herein also bear charges (in addition to stabilizers), which makes it possible to disperse them without aggregation. In doing so, one minimizes the light scattering effects and provides for high transparency and contrast.

The colored pigments of this invention comprise silica particles preferably having a diameter less than about 35 nm e.g., 5 nm to 35 nm preferably 5 nm to 15 nm and a surface area between 80 to 500 m$^2$/g and most preferably 200 m$^2$/g to 500 m$^2$/g, the silica particles to provide a negatively charged surface and a cationic colored dye layer on said silica.

The silica particles used are substantially spherical in nature.

The polymer resin binders used in the color filter resist formulations and other products disclosed herein should possess the following properties:

1. Aqueous base solubility
2. Compatibility with colorant pigments
3. Compatibility with photoimaging package used in resist formulation
4. Capability of forming an insoluble crosslinked network with photo-crosslinker system.

The preferred binders for the non-imaging composition are hydroxyl-containing materials such as acrylic polymers, polyesters, novolacs, and polyimides. For photoimaging compositions, resin binders having acidic groups, e.g. carboxylic acid groups, are particularly preferred. Suitable resin binders having acidic and hydroxyl group substitution include, e.g. acrylic polymer, vinyl polymers other than acrylic polymers, polyesters and polyimides. Acrylic polymers are generally preferred. These binders are suitably prepared by polymerization of one or more monomers or oligomers that comprise free acid groups, particularly unsaturated monomers that contain at least one free hydroxyl or carboxylic acid group. The preferred acrylic polymers can be prepared by the free radical polymerization of acrylic acid, methacrylic acid, the esters or amides thereof, and mixtures of such monomers in an organic solvent.

It is possible to modify the polymer composition to obtain many polymers to satisfy the above requirement. For example, methacrylic acid [MAA] and hydroxyethylmethacrylate [HEMA] in the polymer improves aqueous solubility and film crosslinking efficiency. Methyl methacrylate [MMA] can modulate glass transition temperature and hardness of the polymer. Butyl acrylate [BA] is known to provide heat resistance and adhesion properties for our application. Preferred acrylic polymers are those terpolymers comprising the above four monomers: MMA, HEMA, BA and MMA. Typical weight-% ranges for the four monomers in the tetrapolymers are MAA [5–25%], HEMA [3–30%], MMA [20–80%], and BA [1–50%]. Preferred weight-% ranges for the four monomers in tetrapolymer are MAA [10–15%], HEMA [5–15%], MMA [30–50%], and BA [5–20%].

The cationic dyes preferably used in this invention are selected from xanthene dyes, acid rosamine dyes malachite dyes, mordant which are diamino derivatives of triphenylamines and rhodamine dyes. Suitable dyes for this invention include the following specific dyes:

Rhodamine 6G (Basic Red 1) Aldrich CAT NO. 20,132-4, Sigma Product No. R4127; Sulforhodamine B (Acid Red 52) Aldrich CAT. NO. 23,016-2, Sigma Prod. No. S9012; Rhodamine B (Basic Violet 10) Merck Index 10th Edition Formula Index 8079, Aldrich CAT. NO. R95-2, Sigma Prod. No. R6626; and Rhodamine B (Green) (Sulforhodamine 101 Hydrate) Aldrich Cat. No. 28,491-2, Sigma Product No. S7635, and the following where the numbers are from the text Reference of Color Indexes.

---

42000:2 (C.I. Pigment Green 4) in the phosphotungstomolybdic acid salt

Classical name Malachite Green

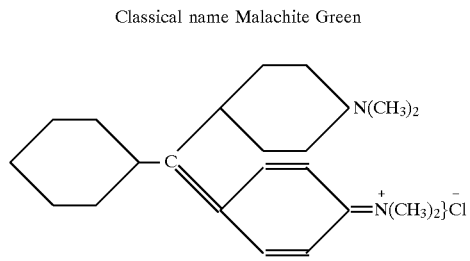

Oxalate-2C$_{23}$H$_{25}$N$_2$ + 3C$_2$H$_5$O$_4$
Zinc Double Chloride-3C$_{23}$H$_{25}$N$_2$Cl.2ZnCl$_2$.2H$_2$O (a) Condense benzaldehyde (1 mol.) with N,N-dimethylaniline (2 mol.) in presence of hydrochloric or sulfuric acid, and oxidise the product with lead peroxide and acid
(b) Heat N,N-dimethylaniline with α,α,α-trichlorotoluene
42005 C.I. Mordant Green 13

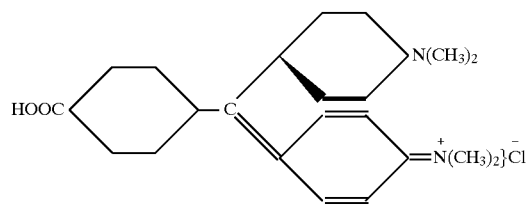

Condense 4,4'-bis(dimethylamino)benzhydrol with benzoic acid and oxidise the product with lead peroxide and acid
42010 C.I. Mordant Green 23 (Bright green)

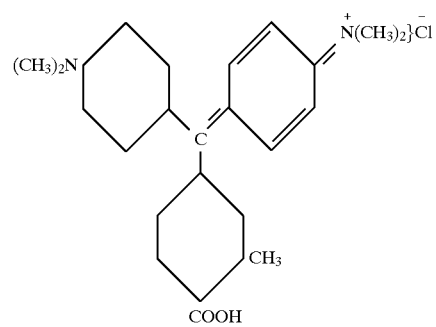

Condense 4,4'-bid(dimethylamino)benzhydrol (1 mol.) with α-toluic acid (1 mol.) and oxidise the product with lead peroxide in acetichydrochloric acid.
42015 C.I. Mordant Blue 52 (Greenish blue)

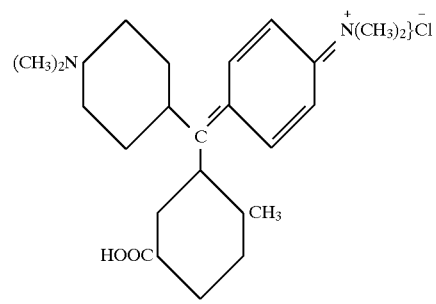

Codense 4,4'-bis(dimethylamino)benzhydrol with ρ-toluic acid, and oxidise the product with lead peroxide-hydrochloric acid.
42050 C.I. Acid Green 8 (Bright green

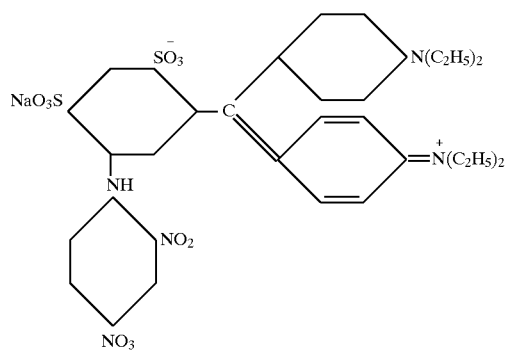

-continued

Condense m-nitrobenzaldehyde (1 mol.) with N,N-diethylaniline (2 mol.), reduce, condense the product with 1-chloro-2,4-dinitrobenzene, disulfonate with oleum, and oxidise with dichromate-oxalic acid It should be understood that while the dyes set forth in this application are preferred, it is to be understood many others or subsequentially synthesized can be used to provide the dye incorporated pigments of this invention.

In this invention, it is preferred that a dispersant for the pigments be added with the preferred amount being in the range of 0.1 to 3 wt/% of the total formulation, e.g., in the resist or color filter formulation or other formulations therein. Table 1 discloses suitable dispersants. Overloading of dispersant limits lithographic performance and underloading promotes agglomeration of the pigments.

TABLE 1

Dispersants

| Product Name | Chemical Identity | Type | Manufacture |
|---|---|---|---|
| Polystep F-3 | Alkylphenol Ethoxylate | Nonionic | Stephan Co. |
| Polystep F-4 | Alkylphenol Ethoxylate | Nonionic | Stephan Co. |
| Ecco Dispersant PDQ | Ethoxylated Phenoxy Condensate | Nonionic | Eastman Chem. Co. |
| Dextrol OC-70 | Phosphate Ester | Nonionic | Dexter Chem. Corp. |
| Alkaterge T-IV | Oxazoline derivatives | Nonionic | Angus Chem. Co. |
| Lomar PWA | Sulfonated naphthalene condensate, ammonium salt | anionic | Henkel Corp. |
| Lomar PW | Sulfonated naphthalene condensate, sodium salt | anionic | Henkel Corp. |
| Lomar P-62 | Sulfonated naphthalene condensate | anionic | Henkel Corp. |
| Diwatex XP 9 | Sulfonated ligin | anionic | Lignotech USA Inc. |
| Monawet MO70 | Dicotyl sodium sulfosuccinate | anionic | Mona Industries Inc. |
| Alkaterge T | Oxazoline derivatives | Amphoteric | Angus Chem. Co. |
| Monazoline O | Oleyl Imidazoline | Amphoteric | Mona Industries Inc. |
| Monazoline T | Tall oil imidazoline | Amphoteric | Mona Industries Inc. |
| Aerosol C-61 | Ethoxylated Octadecylamine-Octadecylguanidine | Cationic | Cytec Industries Inc. |

The typical properties of LUDOX®, sold by DuPont, colloidial silica dispersions useful in this invention are set forth in Tables 2 and 3 below:

TABLE 2

Typical Properties of Ludox Colloidal Silica

| | Grades | | | | | | | |
|---|---|---|---|---|---|---|---|---|
| | HS-40 | HS-30 | TM | SM | AM[a] | AS | LS | CL-X |
| Stabilizing counter ion | Sodium | Sodium | Sodium | Sodium | Sodium | Ammonium | Sodium | Sodium |
| Particle charge | Negative | Negative | Negative | Negative | Negative | Negative | Negative | Negative |
| Av. particle diameter, nm | 12 | 12 | 22 | 7 | 12 | 22 | 12 | 22 |
| Specific surface area, $m^2/g$ | 220 | 220 | 140 | 345 | 220 | 135 | 215 | 130 |
| Silica (as $SiO_2$), wt % | 40 | 30 | 50 | 30 | 30[b] | 40 | 30 | 46 |
| pH (25° C., 77° F.) | 9.7 | 9.8 | 9.0 | 10.0 | 8.9 | 9.1 | 8.2 | 9.1 |
| Titratable alkali | | | | | | | | |
| (as $Na_2O$), wt % | 0.41 | 0.32 | 0.21 | 0.56 | 0.24 | [c] | 0.10 | 0.19 |
| $SiO_2/Na_2O$ (by wt) | 95 | 95 | 225 | 50 | 125 | 220* | 270 | 230 |
| Chlorides (as NaCl), wt % | 0.01 | 0.01 | 0.03 | 0.01 | 0.007 | 0.005 | 0.003 | 0.03 |
| Sulfates (as $Na_2SO_4$), wt % | 0.03 | 0.03 | 0.08 | 0.04 | 0.006 | 0.007 | 0.003 | 0.07 |
| Viscosity (25° C., 77° F.) | | | | | | | | |
| cP, (mPa · s) | 16 | 4 | 40 | 5.5 | 7 | 11 | 8 | 17 |
| Wt per gallon (25° C., 77° F.), lb | 10.8 | 10.1 | 11.6 | 10.1 | 10.0 | 10.7 | 10.0 | 11.4 |
| Specific gravity (25° C., 77° F.) | 1.31 | 1.21 | 1.40 | 1.22 | 1.21 | 1.30 | 1.21 | 1.37 |

[a]Surface modified with aluminate ions
[b]Concentration includes $SiO_2 + Al_2O_3$
[c]Sol contains 0.16% $NH_3$ and 0.08% $Na_2O$ (occluded)
*$SiO_2/NH_3$
The above table gives typical properties based on historical production performance. DuPont does not make any express or implied warranty that these products will continue to have these properties.

TABLE 3

Typical Properties of Ludox Colloidal Silica

|  | SK | TMA | FM | FM-AS | XWP | WP-H | PG |
|---|---|---|---|---|---|---|---|
| Stabilizing counter ion | * | ** | Sodium | Ammonium | Sodium | Sodium | Sodium |
| Particle charge | Negative | Negative | Negative | Negative | Negative | Negative | Negative |
| Av. particle diameter, nm | 12 | 22 | 5 | 5 | 22 | 35 | 22 |
| Specific surface area, $m^2/g$ | 230 | 140 | 450 | 450 | 140 | 80 | 140 |
| Silica (as $SiO_2$), wt % | 25 | 34 | 15 | 14.5 | 40 | 50 | 25 |
| pH (25° C., 77° F.) | 4–7 | 4–7 | 10.1 | 9.2 | 10.5 | 9.6 | 9.3 |
| Titratable alkali (as $Na_2O$), wt % | *** | **** | 0.37 | ***** | NA | 0.27 | 0.11 |

*Deionized sol
**$SiO_2 + Al_2O_3$
***Contains about 0.05% $Na_2O$ (occluded inside the particles)
****Contains about 0.08% $Na_2O$ (occluded inside the particles)
*****Contains approximately 0.15% $NH_3$ and about 0.05% $Na_2O$ (occluded inside the particles)

A liquid crystal display usually comprises two transparent substrates, such as indiumtin oxide coated glass substrates, provided with transparent electrodes and disposed with a gap of the order of 1 μm to 10 μm between these parts, and a liquid crystal material sealed in the gap, wherein the liquid crystal is oriented in a predetermined direction through an alignment layer by application of a voltage between the electrodes, thereby forming transparent and opaque portions, and thus displaying an image. In a color liquid crystal display, a color filter for three colors, i.e., red (R), green (G) and blue (B), corresponding to the three primary colors of light are provided over either of the transparent electrode substrates to yield additive color mixture of the three primary colors by the shutter action of the liquid crystal, thereby displaying a desired color.

Such a color filter for a color liquid crystal display comprises a transparent substrate, a colored layer, a protective film, and a transparent electrically conductive film, which are stacked in the mentioned order. The color filter is disposed to face another transparent substrate, which has electrodes or thin-film transistors formed in opposing relation to the colored pixels of the three primary colors, i.e., R, G and B, with a gap of several μm held therebetween, and a liquid crystal substance sealed in the gap, thereby forming a liquid crystal display.

In FIG. 1, a sectional view of one example of the color liquid crystal display. The color liquid crystal display 1 includes a color filter 2 and an opposing substrate 3 formed with thin-film transistors (TFT) or transparent electrodes. The color filter 2 and the substrate 3 are disposed to face each other across a predetermined gap and bonded together by using a sealing medium 4 formed by mixing reinforcing fibers with an epoxy resin material or the like. A liquid crystal 5 is sealed in the space defined between the color filter 2 and the TFT substrate 3.

The color filter 2 will be explained below more specifically. A substrate 6, for example, a glass substrate, has a black matrix 7 formed thereon so as to divide adjacent colored pixels (a material colored with a dye to form a colored pigment in a resin binder), thus forming a colored layer comprising colored pixels of the three primary colors, that is, red colored pixels 8, green colored pixels 9, and blue colored pixels 10, which are divided from each other by the black matrix 7. In addition, a protective film 11 is provided over the colored layer to protect it, and a transparent electrode film 12 for driving the liquid crystal is provided over the protective film 11. Further, an alignment layer 13 for aligning the liquid crystal is formed over the transparent electrode film 12. The pixels are formed from the pigment formulations of this invention such as disclosed herein. The protective coating (top coat) may be formed from the materials disclosed in U.S. Pat. No. 5,563,011, the entire contents of which are incorporated herein by reference hereto. The procedures for making LCDs and color filters are disclosed in U.S. Pat. No. 5,278,009 which patent entire contents is incorporated herein by reference hereto.

It should be realized that the color filter described in FIG. 1 is prepared from sequential coating, exposing and development of imaging red, green and blue color filter resists, using appropriate masking to fabricate the discrete color pixels as taught in the referenced patents.

Another application for the monodisperse colorants prepared by means of this invention is their use in fabricating color filters for reflective liquid crystal displays, either active matrix or super-twist nematic (STN). The need for high color filter transparency and contrast is all the more essential for this application, as a consequence of the doubling of color filter film path length due to back-surface light reflection. Conventional colorant pigments reduce transparency and contrast for this application, as a result of their low transparency and larger scattering effect.

DYED PIGMENTS

EXAMPLE 1A

The dyes used in this example are as follows:

Rhodamine 6G (Basic Red 1) Aldrich CAT NO. 20,132-4, Sigma Product No. R4127; Sulforhodamine B (Acid Red 52) Aldrich CAT. NO. 23,016-2, Sigma Prod. No. S9012; Rhodamine B (Basic Violet-Blue 10) Aldrich CAT. NO. R95-2, Sigma Prod. No. R6626; and Rhodamine B (Green) (Sulforhodamine 101 Hydrate) Aldrich Cat. No. 28,491-2, Sigma Product No. S7635.

Preparation

A dye solution was prepared using 2 grams of the dye in 100 and 200 mls distilled water 40 mls of dye solution to 10 mls of the dispersion of Ludox particle (Dupont) types AM, SK, AS, SM and CL-X silica negative charged particles containing ammonium or sodium ions. The silica particles were combined with the dye solution in a disposable centrifuge tube for 30 minutes. The dyed particles were then separated from the solution and immediately treated with 0.13% weight-% of dispersant; preferably any of the nonionics and most preferably the Polystep F-3 or F-4 dispersants (see Table 1) to prevent agglomeration.

EXAMPLE 1B

CI Pigment Green 4
CI Mordant Green 13
CI Mordant Blue 52
Rhodamine 6G

Preparation:

Approximately 100 gm of LUDOX silica particles (AS FM-AS,) stabilized with ammonium cation are neutralized of excess ammonia using 100 ml of 0.1N $Na_2CO_3$ solution. Following decantation and litmus testing of the supernatant liquid, the LUDOX dispersion was re-diluted to approximately 10 weight % with water. To the neutralized LUDOX dispersion is added 2 gms of the dyes set forth above in 50–100 ml distilled water. The 2 gms of dye as described above is 50–100 ml distilled water particles dispersions are allowed to stand about 30 min. Thereafter, the dyed colored particles are centrifuged and the resulting supernatant liquid is decanted. The centrifuged particles are then suspended in the photoresist solvent and immediately dispersed with 0.1–0.2% weight % of dispersant; preferably using the non-ionic dispersants and most preferably using the Polystep F-3 or F-4 dispersants, to preclude particle agglomeration.

EXAMPLES OF NON-IMAGING COLOR FILTER RESIST

EXAMPLE 2

A polyimide-based color filter containing monodisperse colorant pigments prepared by the methods of this invention is presented as an example of a non-imaging non-photosensitized color filter resist. A film forming organic-based color filter is made of 15–30 weight % poly [dimethylglutarimide] of weight-average molecular weight range of 5,000–100,000 and a number-average molecular weight range of 2,000–20,000 is dissolved in a solvent system using, either in all combinations, or separately, mixtures of propylene glycol methyl ether acetate, cyclopentanone, propylene glycol methyl ether, ethyl lactate, cyclohexanone, 3-ethoxyethylpropionate, and/or 3-methoxymethyl propionate. Monodisperse colorant pigments prepared via the methods of this invention [Red, Green, Violet-Blue] Examples 1A and 1B are then dispersed in the polymeric solution (polymer resin binder) respective to the color required, either separately or in blends as needed to fine-tune color specifications, using dispersants known to the pigment and color filter industry, with agitation e.g. Polystep F-3 (an alkylphenol ethoxyfate nonionic type, Stephan Co.), for a 24 hr. period. The total solids of monodisperse colorants used in this invention range from 30 to 70 weight %, with the preferred embodiment in the 40–65 weight-% range. Following successful dispersion, the resulting colored dispersion is filtered through a series of coarse and fine filters, either absolute or depth, into a clean brown bottle, or a vessel appropriate for user application.

EXAMPLE 3

A non-imaging color filter resist made as in Example 2, using a poly[amic acid-imide] polymer in place of poly [dimethylglutarimide], of weight-averaged molecular weight range [5,000–100,000] and number-averaged molecular weight range of 2,000–20,000 is prepared. A preferred polymer for this example is in the molecular weight range [10,000–30,000] and is the condensation polymer of pyrromellitic dianhydride [PDMA] and oxydianiline [ODA], such as DuPont Kapton™ polymer.

EXAMPLE 4

A non-imaging color filter resist made as in Example 2, using an epoxy-novolak polymer, of weight-averaged molecular weight range [3,000–20,000] and of number-averaged molecular weight range [600–2,000] with a thermal acid generator (TAG) nitrobenzyl tosylate to crosslink the polymer upon thermal cure is prepared. A preferred polymer for this example is 1,4-butanediol diglycidyl ether of phenol formaldehyde novolak, such as Dow Chemical DEN-431.

EXAMPLE 5

A non-imaging color filter resist made as in Example 2, using the preferred embodiment of the invention, an acrylic terpolymer, and the specific modification using, as an incorporated monomer, an epoxy-acrylate, to give a tetra polymer is prepared. A TAG such as p-nitrobenzyl tosylate is used in the color filter formulation to crosslink the polymer upon thermal cure, thereby hardening the film to prevent intermixing with the top-imaging photoresist layer. A preferred polymer for this example is the acrylic tetrapolymer of 5 mole-% methacrylic acid [MAA], 10 mole-% glycidyl methacrylate [GMA], 20 mole-% butyl acrylate [BA] and 65 mole-% methyl methacrylate [MMA].

EXAMPLE 6

A non-imaging color filter resist, made as described in Example 5, but using the preferred acrylic polymer set forth herein is prepared. The non-crosslinking color filter material is primarily used for LASER Ablation Transfer Technology [LATT] applications. The preferred acrylic polymer for this example is the acrylic tetrapolymer consisting of 5 mole-% methyacrylic acid [MAA], 15 mole-% hydroxyethyl-methacrylate [HEMA], 10 mole% butyl acrylate [BA] and 70 mole-% methyl methacrylate [MMA].

EXAMPLES OF COLOR FILTER IMAGING PROCESSES USING NON-IMAGING COLOR FILTER MATERIALS

EXAMPLE 7

The non-imaging color filter material from Example 2 is used in conjunction with an imaging g-Line or i-Line sensitive positive or negative-tone photoresist, in the following manner: The color filter resist from Example 2 is coated onto glass, silicon, indium-tin oxide (ITO) on glass, or other substrates, using either spin coating, or a reduced-volume dispense method, such as slot coating, to film thickness satisfying color chromaticity requirements for the application. The resist film is then thermally cured of excess solvent and, following further cure-hardening to form a solid polymer, is overcoated with an imaging photoresist.

The top photoresist layer is then imaged using methods well known in the art. Thereafter, the bottom color filter layer is etched through the already-patterned top-imaging resist, using an aqueous tetramethyl ammonium hydroxide (TMAH) based or metal hydroxide-based developer, of sufficient strength to remove the full thickness of color filter resist in a 1–5 minute time period. Following the color filter etching process, the top-layer resist is removed with an organic solvent, such as acetone, which does not attack the bottom-layer color filter resist.

This process is repeated serially until all color filter materials are patterned as needed for the application. For example, in the case of color filter mosaic fabrication for an Active matrix Liquid Crystal Display [AMLCD], this process is performed using the 3 primary color filter materials; red, green and blue. For other applications, such as Charge-Coupled Device [CCD] and complimentary metal on silicon [CMOS] imager chips, the use of the three primary red, green, and blue color filter materials, or the three secondary color filters, magenta, yellow and cyan, likewise processed, is used.

EXAMPLE 8

The color filter materials described in Example 3 are processed in the same manner as shown in Example 7 above, but the film curing temperature is adjusted to convert the (polyamic acid-imide) to its mostly imidized form. This cure will provide the color filter film with sufficient chemical resistance to prevent intermixing with the top-imaging resist.

EXAMPLE 9

The color filter materials from Example 4 are processed in a similar manner to those shown in Examples 7 and 8, except that the epoxy-novolac is cured at a temperature sufficient to activate the thermal acid generator p-nitrobenzyl tosylate, thereby initiating the crosslinking process. Following imaging of the top resist layer, the bottom crosslinked color filter layer is either wet-etched with strong aqueous base or dry-etched with an oxygen plasma through the patterned resist top-layer. Following bottom-layer imaging, the sacrificial imaged top-layer resist is removed, as described in Example 7.

EXAMPLES OF COLOR FILTER APPLICATIONS TO FLAT PANEL DISPLAY AND OTHER USES

EXAMPLE 10

Active Matrix Liquid Crystal Displays [AMLCD]:

The imaging and non-imaging resists employing the monodisperse colorant systems described in this invention application may be used for AMLCD applications. The AMLCD color filter mosaic is prepared using the process described in Example 7, to pattern 20–100 $\mu m^2$ square pixels. The primary advantages of the invention for AMLCD application are (1) the improved color contrast of the resulting color filter, and (2) the improved cleanliness of development, when compared to color filter resists using standard pigment-dispersions.

EXAMPLE 11

Charged Coupled Device [CCD] or CMOS Imager Devices

The imaging photoresists employing the monodisperse colorant systems in this application may be used for CCD and CMOS Imager devices. These devices, fabricated as part of the microlithographic process on silicon, involve the same steps as described in Example 7, but for 1–20 $\mu m$ lithographic dimensions. The primary advantage for these devices is the clean resist development in open-field and line-edge areas, which allows for better effective resolution than that afforded through use of standard pigment-dispersion based color filter resists.

EXAMPLE 12

LASER Ablation Transfer Technology: [LATT]

The non-imaging color filter resists incorporating the monodisperse colorant materials, as described, in Example 6 is useful in LATT. The LATT process using the non-imaging color filter resists physically transfers donor-plate coated material to an acceptor plate, via backside exposure of the donor plate to directed LASER energy. This process is repeated 3 times, or as many times as needed depending on the number of colors to be patterned.

EXAMPLE 13

Ink Jet Printing Inks For Color Filters

An ink for color ink jet printing of color filter applications is prepared by mixing the pigments prepared in Examples 1A or 1B herein with the ink compositions set forth in U.S. Pat. Nos. 5,607,999 in Example 1 thereof wherein the colored pigments herein are used in place of the carbon black CB(MA-100). The entire contents of U.S. Pat. No. 5,607,999 is incorporated herein by reference hereto. The other Examples in this U.S. Pat. No. 5,607,999 may also be used.

The small uniform nature of the monodisperse particles allows clean transfer of fluid through the ink jet port with minimal chance of clogging.

EXAMPLE 14

Green Pigment Coating Formulation

Materials:
(1) 205.80 g. Mordant Green 13 dyed pigment
(2) 56.85 g. polymer
(3) 10.70 g. 2(2'-furylethylidene)-4,6-bis(trichloromethyl)-s-triazine
(4) 2.35 g. phenothiazine
(5) 26.8 g. hexamethoxymethylmelamine
(6) 190.79 g. propylene glycol monomethylether acetate The polymer above comprises 15 mole-% methylacrylic acid (MMA), 8 mole-% hydroxymethylacrylate (HEMA), 16 mole-% butyl acrylate (BA) and 61 mole-% methylacrylate. The pigment is dyed alumina coated silica particles prepared as described herein and has about 7 nm average diameter.

In this example (all parts) all amounts are in grams.
Procedure:
1. Weigh pigment, polymers, and solvent into a suitable sized container.
2. Roll mixture with mill beads for at least one hour.
3. Add remaining components.
4. Roll overnight to form the final coating formulation.

EXAMPLE 15

Violet Pixel Coating Formulations

Materials:
(1) 190 g. Violet-Blue dyed pigment.
(2) 57.87 g. polymer
(3) 9.67 g. 2(2'-furylethylidene)-4,6-bis(trichloromethyl)-s-triazine
(4) 2.05 g. phenothiazine
(5) 24.0 g. hexamethoxymethylmelamine The polymer is the same as in Example 13. The pigment is dyed alumina coated silica particles prepared as described herein and has about 7 nm average diameter. The formulation is prepared the same way as in Example 13 above.

EXAMPLE 16

Red Pixel Coating Formulation

Materials:
(1) 241.948 g. Rodamine 6G (Basic Red 1)
(2) 56.25 g. polymer
(3) 10.948 g. 2(2'-furylethylidene)-4,6-bis(trichloromethyl)-s-triazine
(4) 2.198 g. phenothiazine
(5) 26.25 g. hexamethoxymethylmelamine
(6) 90.42 g. propylene glycol monomethylether acetate The polymer is the same as in Example 13. The pigment is dyed alumina coated silica particles prepared as described herein and has about 7 nm average diameter. The formulation is prepared the same way as in Example 13 above.

EXAMPLE 17

Blue Pixel Coating Formulations

Materials:
(1) 313.95 g. Mordant Blue 52 dyed pigment
(2) 56.25 g. polymer
(3) 10.94 g. 2(2'-furylethylidene)-4,6-bis(trichloromethyl)-s-triazine
(4) 2.198 g. phenothiazine
(5) 26.25 g. hexamethoxymethylmelamine
(6) 90.42 g. propylene glycol monomethylether acetate Pigment is dyed silica particles prepared as described herein. The formulation is prepared the same way as in Example 13 above.

We claim:

1. A colored pigment having an average diameter less than about 35 nm comprising silica particles having an average diameter of less than about 35 nm and a surface area between 80 to 500 $m^2/g$, said particles having a negatively charged surface which has sodium or ammonium counter ions and a cationic colored dye layer adsorbed on said surface.

2. A color film comprising the pigment of claim 1 dispersed in a solid polymer to a loading of no more than 70% by weight.

3. A negative-tone imaging color filter photoresist comprising nanosized pigments of claim 1 in a polymer.

4. A non-imaging color filter photoresist comprising nanosized colored pigments of claim 1 in a binder.

5. A color filter comprising a transparent substrate, colored pixels on said substrate containing colored pigments and a resin binder as a solid, said pixels comprising pigments having an average diameter less than about 35 nm and comprising negatively charged silica having colored cationic dye adsorbed on said silica.

6. An LCD including a color filter including the colored pigments of claim 1.

7. A color film or resist in which the colored pigment of claim 1 is dispersed in a polymer binder to a maximum loading of 70% and a dispersant, said dispersant for said pigments in an amount of 0.1 to 3 weight % by total weight of the film or resist.

8. The colored pigment of claim 1 in which the diameter is about 5 nm to less than about 35 nm.

9. A colored pigment having an average diameter of less than about 35 nm comprising deionized silica particles having an average diameter of less than about 35 nm and a surface area between 80 to 500 $m^2/g$, said particles having a negatively charged surface and a cationic colored dye layer adsorbed on said surface.

10. A color film comprising the pigment of claim 9 dispersed in a solid polymer to a loading of no more than 70% by weight.

11. A negative-tone imaging color filter photoresist comprising nanosized pigments of claim 9 in a polymer.

12. A non-imaging color filter photoresist comprising nanosized colored pigments of claim 9 in a binder.

13. A color filter comprising a transparent substrate, colored pixels on said substrate containing colored pigments and a resin binder as a solid, said pixels comprising pigments having an average diameter less than about 35 nm and comprising negatively charged silica having colored cationic dye adsorbed on said silica.

14. An LCD including a color filter including the colored pigments of claim 9.

15. A color film or resist in which the colored pigment of claim 9 is dispersed in a polymer binder to a maximum loading of 70% and a dispersant, said dispersant for said pigments in an amount of 0.1 to 3 wt/% by total weight of the film or resist.

16. The colored pigment of claim 9 in which the diameter is about 5 nm to less than about 35 nm.

* * * * *